(12) United States Patent
Lu et al.

(10) Patent No.: US 7,312,512 B2
(45) Date of Patent: Dec. 25, 2007

(54) INTERCONNECT STRUCTURE WITH POLYGON CELL STRUCTURES

(75) Inventors: Ding-Chung Lu, Hsinchu (TW); Chao-Hsiung Wang, Hsin-Chu (TW); Cheng-Yuan Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 128 days.

(21) Appl. No.: 11/237,356

(22) Filed: Sep. 28, 2005

(65) Prior Publication Data

US 2007/0069381 A1    Mar. 29, 2007

(51) Int. Cl.
*H01L 29/00*    (2006.01)
*H01L 23/48*    (2006.01)
*H01L 23/52*    (2006.01)

(52) U.S. Cl. .................. 257/522; 257/758; 257/760; 257/E21.573

(58) Field of Classification Search ........... 257/760, 257/758, 522, 759, E21.573
See application file for complete search history.

(56) References Cited

U.S. PATENT DOCUMENTS

| | | | |
|---|---|---|---|
| 5,994,776 A * | 11/1999 | Fang et al. .............. | 257/758 |
| 6,448,650 B1 | 9/2002 | Saran et al. .............. | 257/758 |
| 6,551,919 B2 * | 4/2003 | Venkatesan et al. ........ | 438/622 |
| 6,800,571 B2 * | 10/2004 | Cheung et al. ............ | 438/790 |
| 2002/0025417 A1 | 2/2002 | Chisholm et al. .......... | 428/209 |
| 2003/0213958 A1 | 11/2003 | Nakagawa et al. .......... | 257/66 |
| 2004/0195719 A1 | 10/2004 | Ishii et al. ............. | 264/177.12 |

OTHER PUBLICATIONS

"ULVAC's s-k Film" http://sst.pennnet.com/Articles/Article Display.cfm?Article ID=91285.
"Cellular Solids" Gibson, MAR Bulletin, Apr. 2003, vol. 28, No. 4.
"Cellular Ceramics: Intriguing Structures, Novel Properties, and Innovative Applications" Green, et al., MAR Bulletin, Apr. 2003, vol. 28, No. 4.

* cited by examiner

*Primary Examiner*—Nitin Parekh
(74) *Attorney, Agent, or Firm*—Thomas, Kayden, Horstemeyer & Risley

(57) ABSTRACT

Interconnect structures with polygonal cell structures. An exemplary interconnect structure comprises a substrate and a first dielectric layer, overlying the substrate and exposing a conductive feature formed therethrough and connected with the substrate, wherein the first dielectric layer includes a plurality of polygon cell structures with hollow interior.

18 Claims, 13 Drawing Sheets

INTERCONNECT STRUCTURE WITH POLYGON CELL STRUCTURES

BACKGROUND

The present invention relates to semiconductor structure, and in particular to an interconnect structure for semiconductor devices with hollow honeycomb-like dielectric integrated with conductor.

Reduction of integrated circuit feature size has resulted in levels of electrically conductive interconnects being placed closer together vertically, as well as reduction of the horizontal spacing between the electrically conductive interconnects, such as metal lines. As a result, capacitance has increased between such conductive portions, resulting in RC (resistance×conductance) delay time and crosstalk-effect. One proposed approach to this problem is to replace the conventional silicon oxide ($SiO_2$) dielectric material, having a dielectric constant (k) of about 4.0, with another insulation material having a lower dielectric constant to thereby lower capacitance.

Unfortunately, low-k dielectric materials have various problems that make integration into existing integrated circuit structures and processes difficult. Compared to conventional silicon dioxide ($SiO_2$), most low-k materials, due to the inherent structures thereof, especially for porous ultra low-k dielectric, typically present characteristics such as lower mechanical strength and unstable stress levels. These issues are critical as processing and packaging due to weak mechanical strength. Thus, the replacement of conventional silicon dioxide ($SiO_2$) with ultra low-k dielectric material in integrated circuit (IC) processes or structures generates structural damage when subjected to external stress during processing, thereby affecting reliability of a formed semiconductor device.

In the field of aerospace, the optimization of structure strength and weight of airplane is to use honeycomb-like structure based on FEM (Finite Element Method) calculation after WW2 and constituted by Al, Ti, alloys thereof and even composite-based material. It is pretty straightforward thinking to apply and integrate honeycomb-like dielectric structure into the most advanced semiconductor device for best electrical as well as mechanical performance.

Thus, an interconnect structure incorporating low-k dielectric material with reinforced mechanical strength is desired.

SUMMARY

Interconnect structures with hollow honeycomb-like cell structures are provided. An exemplary embodiment of an interconnect structure comprises a substrate and a first dielectric layer overlying the substrate, exposing a conductive feature formed through the first dielectric layer and connecting the substrate, wherein the first dielectric layer includes a plurality of polygon cell structures with hollow interior.

An exemplary embodiment of a dual damascene structure comprises a substrate and a first dielectric layer with a conductive via/contact therein, overlying the substrate and electrically connecting the substrate. A second dielectric layer with a conductive line therein overlies the first dielectric layer, wherein the conductive line electrically connects the conductive via/contact and at least one of the first and second dielectric layers includes a plurality of polygon cell structures with hollow interior.

Another embodiment of a semiconductor device comprises a substrate with at least one device thereon. A first dielectric layer with a conductive contact therein overlies the substrate, and electrically connecting the device. A second dielectric layer with a conductive feature therein over the first dielectric layer, wherein the first dielectric layer includes a plurality of honeycomb-like polygon cell structures with hollow interior and the conductive feature electrically connects the conductive contact.

Moreover, since the proposed porosity of ultra low-k dielectric is relatively high, the sealing issue between dielectric and conductor is important in considering device reliability and performance.

A detailed description is given in the following embodiments with reference to the accompanying drawings.

BRIEF DESCRIPTION OF THE DRAWINGS

The invention can be more fully understood by reading the subsequent detailed description and examples with reference made to the accompanying drawings, wherein.

DESCRIPTION

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers. Use of the term "low dielectric constant" or "low k" herein describes a dielectric constant (k value) less than the dielectric constant of a conventional silicon oxide. Preferably, the dielectric constant of the low k is less than about 3.9.

Interconnect structures with polygon cell structures will now be described here in greater detail. Some embodiments of the invention, such as the exemplary embodiments described can potentially enhance mechanical strength of a dielectric layer and also reduce the dielectric constant thereof. In some embodiments, this can be accomplished by forming a plurality of polygon cell structures with hollow interior in at least one dielectric layer of an interconnect structure. In the exemplary embodiments, the interconnect structures are illustrated in a dual damascene structure. It will be understood by those skilled in the art that the invention can be applied to a single damascene structure or other traditional conductor etching process.

Figure 1:
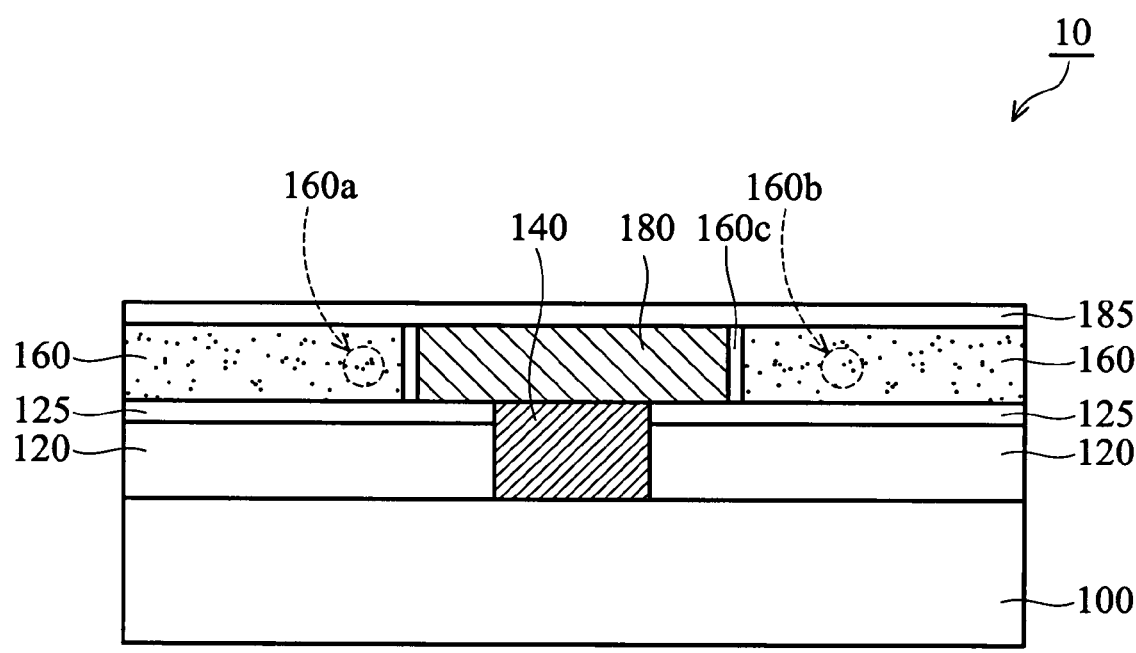
FIG. 1 is a schematic diagram of an embodiment of an interconnect structure including polygon cell structures with hollow interior of the invention.

Referring now to the drawings, FIG. 1 is a schematic diagram of an exemplary embodiment of an interconnect structure for semiconductor devices. In FIG. 1, an interconnect structure 10 includes a semiconductor substrate 100 with a dielectric layer 120 formed thereon. A conductive feature 140, such as a conductive via, is provided with the dielectric layer 120. Further, a dielectric layer 160 is provided with a conductive feature 180, such as a conductive line, formed therein, overlying the dielectric layer 120. Optionally, a dielectric layer 125 is formed between the dielectric layers 120 and 160, composing materials different to that of the dielectric layer 160, and provides proper etch stop function during formation of the conductive feature 180. Moreover, a dielectric barrier/liner 160c may optionally formed along a boundary between the conductive feature 180 and the dielectric layer 160. Dielectric layer 185 is formed over the dielectric layer 160, covering the conductive feature 180 therein, and functions as an etch stop layer in sequential fabrication. The conductive feature 180 and the conductive feature 140 are respectively formed through the dielectric layers 160 and 120, thus the overlying conductive feature 180 electrically connects the semiconductor substrate 100 through the underlying conductive feature 140 to thereby form an interconnect structure 10.

Herein, the dielectric layer 160 comprises a plurality of polygon cell structures with hollow interior (not shown). The polygon cell structures with hollow interior are described later in greater detail through the schematic diagrams of FIGS. 2a-2f. The interconnect structure 10 can be formed by conventional processes such as damascene process incorporating conventional dielectric material or low-k dielectric material that are well known by those skilled in the art. The dielectric layers 120 and 160 may comprise conventional dielectric material such as silicon oxide or low-k dielectric material such as fluorosilicate glass (FSG), SiOC, SiON, carbon-containing material or the like. The conductive feature 140 and the conductive feature 180 may comprise conductive materials such as aluminum, copper, tungsten or alloys thereof.

In FIG. 1, the semiconductor substrate 100 may comprise integrated circuit (IC) devices and multilayer interconnection structures formed thereon. The integrated circuit devices can be active or passive devices formed on the semiconductor substrate 100, and the multilayer interconnection structures can be multiple metallization layers supported and spaced by inter-layer dielectrics. The IC devices and multilayer interconnection structures formed, however, are not shown on the semiconductor substrate 100 for simplicity.

Herein, the dielectric layer 160 with a plurality of polygon cell structures with hollow interior (not shown) formed therein can enhance mechanical strength and reduce the effective dielectric constant thereof. Normally, the dielectric layer 160 is formed at a thickness of about 1000 Å to 10000 Å and the polygon cell structures with hollow interior formed therein are of 50 vol % to 100 vol % of the dielectric layer 160 to thereby provide an effective porosity of about 20 vol % to 80 vol %. The above dielectric layer 125, 185 and 160c have porosity larger than that of the dielectric layer 160 to prevent undesired metal diffusion from the conductive feature 180. The dielectric layers 125 and 185 are formed at a thickness less than 500 Å, preferably about 200-500 Å. The dielectric layer 160c is formed at a thickness of about 30-150 Å and can be formed by treating portions of the dielectric layer 160 adjacent to the conductive feature 180 by methods such as thermal or radiation treatments. In addition, the dielectric layer 120 is formed at a thickness of about 1000 Å to 5000 Å. In the dielectric layer 160, the polygon cell structures with hollow interior can be formed in a 2D layered structure, 3D stereo polygonal structure or combination structure thereof such as polygonal pillars (e.g. 2D layered structures) or polygonal cubes (e.g. 3D stereo structure) or the a combination structure thereof.

The polygon cell structures with hollow interior may be formed in the dielectric layer 160 with uniform or varied density. As shown in FIG. 1, the polygon cell structures with hollow interior formed in a first region 160a adjacent to the conductive line 180 may have a higher cell density to provide additional mechanical strength against stress and down forces induced by formations of the conductive feature 180 and can thus prevent undesired collapse of the dielectric material near the conductive interconnects that may occur in conventional interconnect structures incorporating low-k dielectric material. The polygon cell structures with hollow interior formed in a second region 160b of the dielectric layer 160 away from the conductive feature 180 may have a lower density than that of the first region 120a since there is no conductive feature thereon.

The polygon cell structures with hollow interior formed in the dielectric layer 160 can enhance mechanical strength and reduce the effective dielectric constant thereof. Normally, the dielectric layer 160 may have a dielectric constant of about 1.2-2.5. Moreover, the polygon cell structures with hollow interior can also optionally formed in the dielectric layer 120 to further enhance mechanical strength and reduce the effective dielectric constant of such interconnect structure but is not shown here for simplicity Therefore, the conductive feature 140 and the conductive feature 180 in FIG. 1 are thus passivated and supported, preventing underside collapse in conventional low-k dielectric material and also providing a dielectric layer with low dielectric constant. Therefore, a reliable interconnect structure with a mechanically reinforced and dielectric constant lowered dielectric layer is thus formed and electrical performance such as time dependant dielectric breakdown (TDDB), RC delay or electromigration (EM) thereof may thus enhanced.

Shapes of the polygon cell structures with hollow interior are described later in greater detail through schematic diagrams FIGS. 2a-2d. As the exemplary embodiments shown in FIGS. 2a-2d, cross sections of the first region 160a of the dielectric layer 160 are illustrated as a plurality of closely and orderly arranged polygonal cell structures with hollow interior. It will be understood by those skilled in the art that the polygonal cell structures with hollow interior can be non-orderly arranged in the dielectric layer 160 and are not shown here.

Figure 2A:
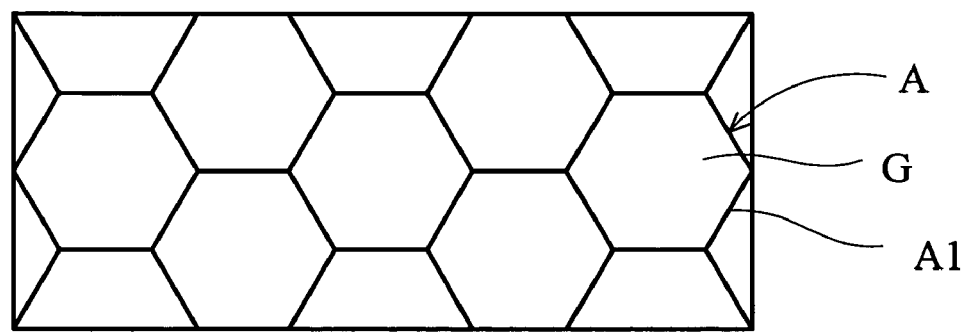
FIGS. 2a-2d are schematic diagrams showing examples of cross sections of the exemplary polygonal cell structures with hollow interior of the invention.
Figure 2B:
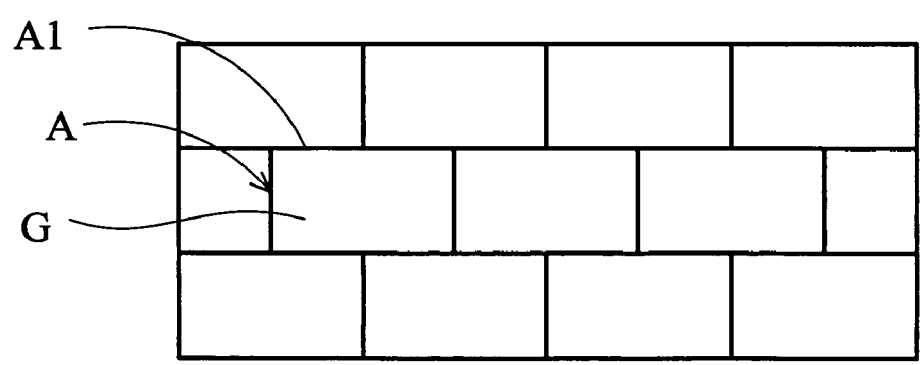
Figure 2C:
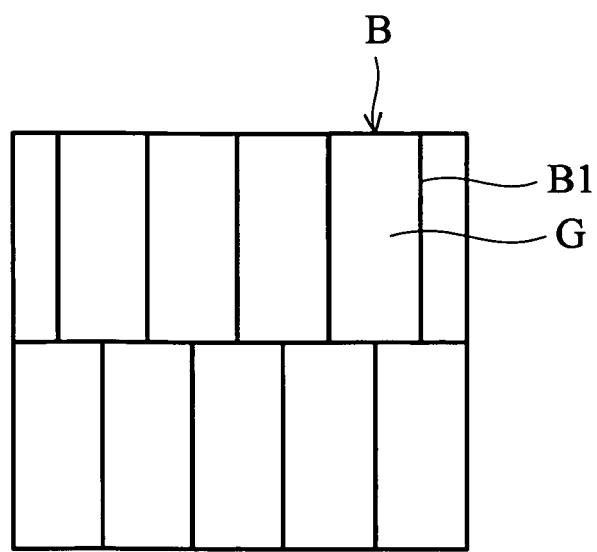
Figure 2D:
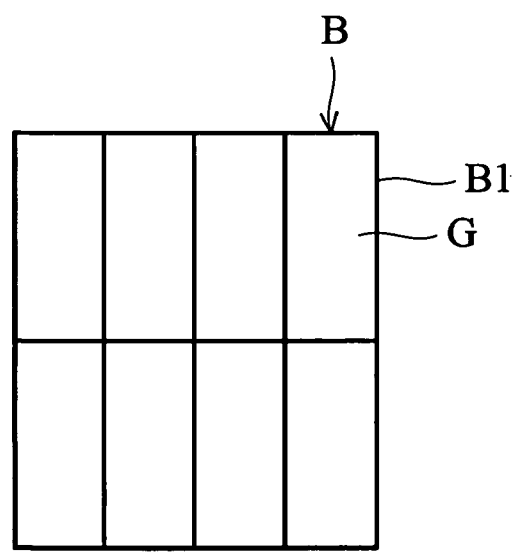
Figure 2E:
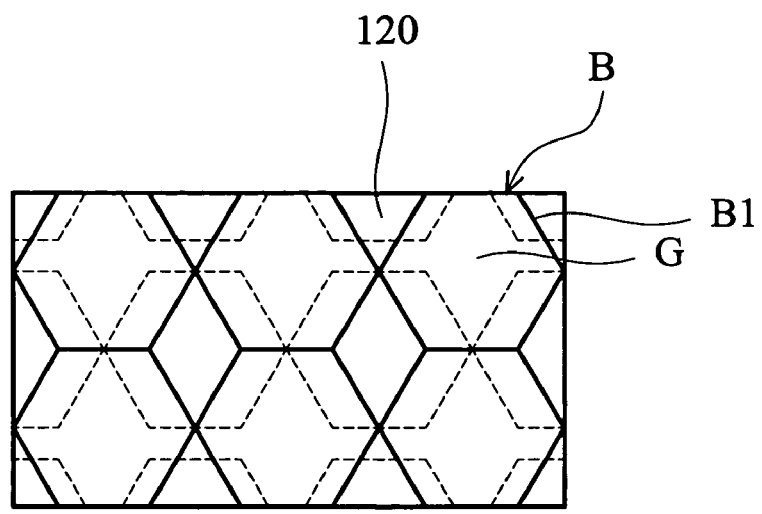
FIGS. 2e and 2f are schematic diagrams showing a top view of the exemplary polygonal cell structures with hollow interior illustrated in FIGS. 2c and 2d.
Figure 2F:
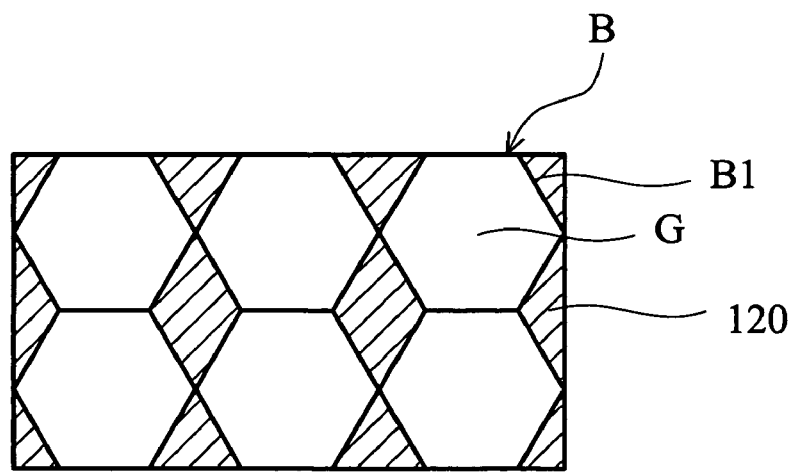

These polygonal cell structures with hollow interior formed in the first region 160a are formed as polygonal dielectric cubes A such as the substantially hexagonal or quadrilateral cubes respectively shown in FIGS. 2a and 2b, or polygonal pillars B shown in FIGS. 2c and 2d. FIGS. 2e and 2f are schematic diagrams respectively showing top views of the polygonal pillars B in FIGS. 2c and 2d. The polygonal pillars B in FIGS. 2e and 2f are illustrated as a hexagonal top surface but are not limited thereto. The polygonal cubes A may be formed as other polygonal walls and the polygonal pillars B may be formed with other polygonal top surfaces such as a quadrilateral top surface. It is noticed that the polygonal cubes A and the polygonal pillars B can be formed in various shapes other than the described hexagonal or quadrilateral shapes and may also include irregularities.

As shown In FIGS. 2a and 2b, each polygonal cube A is illustrated as a closed cell sealed by a plurality of walls A1 encapsulating air G therein to thereby form a hollow cube. The wall A1 comprises the same material as the dielectric layer 160 at a thickness of less than 50 Å. However, openings (not shown) may be formed in some walls A1 of each polygonal cube A to thereby form a plurality of closely arranged polygon cell structures including some opened cells and an empty conduit therein.

As shown In FIGS. 2c and 2d, each polygonal pillar B is illustrated as a closed cell sealed by a plurality of walls B1 encapsulating air G therein to thereby form a hollow pillar. The wall B1 comprises the same material as the dielectric layer 160 at a thickness of less than 50 Å. However, openings (not shown) can be formed in some walls B1 of each polygonal cube B to thereby form a plurality of closely arranged polygon cell structures including some open cells and may form a channel therein.

In FIG. 2c, the polygonal pillars B can be stacked in a manner such that the polygonal pillars B in an upper level overlie portions of the underlying polygonal pillars B (illustrated as a polygon cell structure with polygon shape on ends of tubes). Further, as shown in FIG. 2d, the polygonal pillars B are stacked in a laminated manner, the polygonal pillars B in an upper level are over the underlying polygonal pillars B.

The polygon cell structures with hollow interior can be orderly arranged in the dielectric layer 160 to form a honeycomb-like structure in which providing stronger structural reinforcements than a conventional bulk dielectric layer without such polygon cell (e.g., honeycomb-like) structures, as illustrated in FIGS. 2a-2d. The polygon cell structures with hollow interior can be substantially orderly or randomly arranged in the dielectric layer 120 and are not restricted to the arrangement shown in FIGS. 2a-2d. Moreover, since the dielectric layer 160 comprises the polygonal dielectric cubes A or pillars B with hollow interior encapsulating air of a dielectric constant of 1, the effective dielectric constant of the dielectric layer 160 is thus reduced.

Moreover, the polygonal cubes A or pillars B have an average feature size of about 10 to 100 Å. Feature size of each polygon cell structure is defined as a maximum length of a diagonal in cubes or cross section of pillars thereof.

The dielectric layer 160 with the described polygonal cell structures with hollow interior can comprise conventional dielectric materials or low-k dielectric material such as silicon oxide, FSG, carbon-doped silicon oxide, silicon carbide or other carbon-containing materials is and can be formed by methods such as spin coating, chemical vapor deposition (CVD), sol-gel, physical deposition process, replication techniques, or combinations thereof with or without uses of templates. The replication techniques is disclosed in the paper entitled "Cellular Solids" in vol. 28, No. 4 of MRS BULLETIN, by Gibson et al., published at April 2003, pp 270-271, and is incorporated herein by reference. Other like methods for forming polygonal cell structures with hollow interior are disclosed in the paper entitled "Foam Structure: Form Soap Froth to Solid Foams" in vol. 28, No. 4 of MRS BULLETIN, by Kraynick, published at April 2003, pp 275-278 and the paper entitled "Cellular Ceramics: Intriguing structures, Novel Properties, and Innovative Applications" also in vol. 28, No. 4 of MRS BULLETIN, by Green et al., published at April 2003, pp 275-278. Both of the above papers are incorporated herein by reference.

Figure 9:
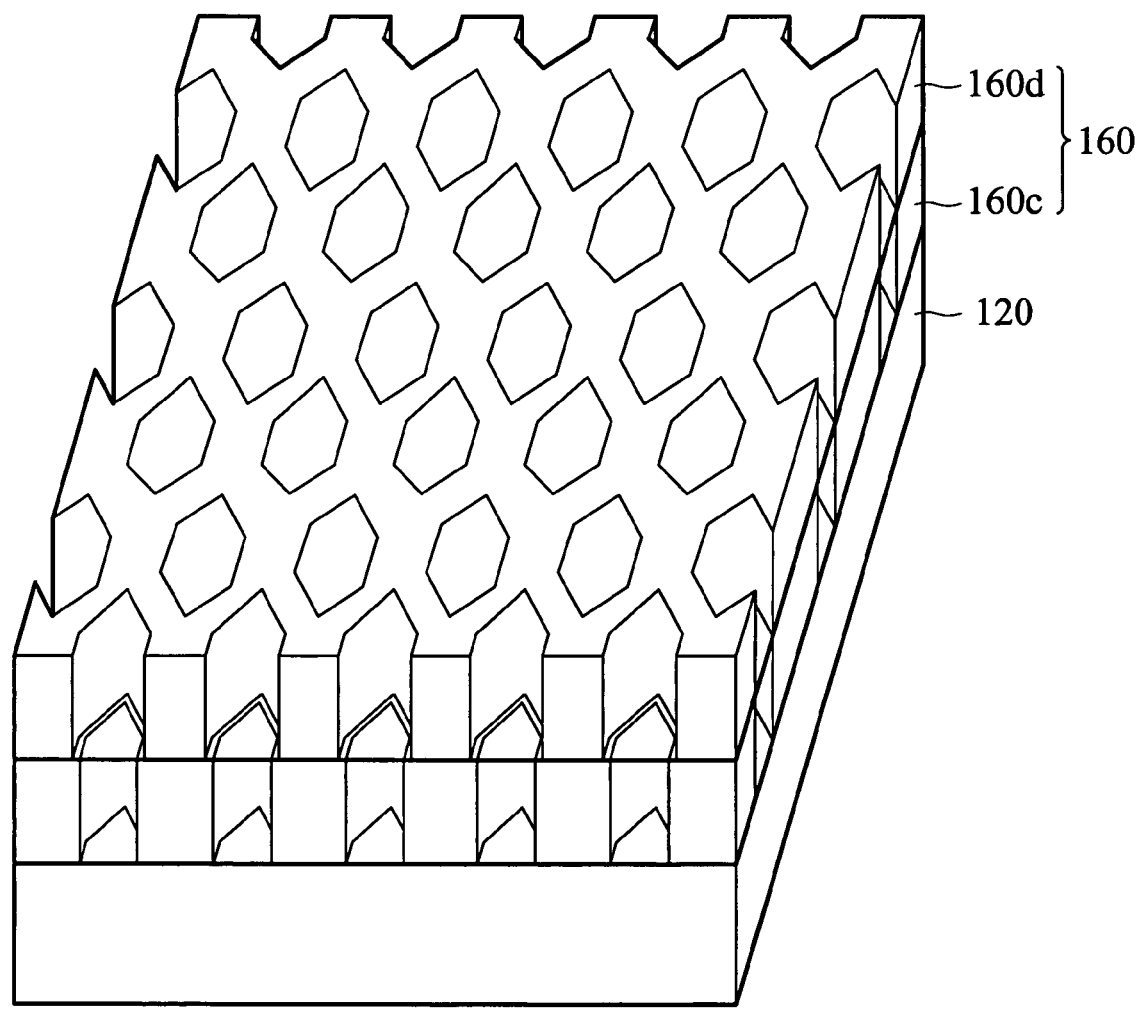
FIG. 9 is a schematic diagram showing exemplary polygon cell structures formed in the dielectric layer 160 of FIG. 1.

Next, FIG. 9 and FIGS. 10a-10h are schematic diagrams showing fabrication of an exemplary polygon cell structure may formed in the dielectric layer 160 of FIG. 1, wherein FIG. 9 shows a top view of a portion of the dielectric layer 160 and FIGS. 10a to 10h illustrate fabrication steps during formation of the same.

Referring to FIG. 9, an exemplary embodiment of the dielectric layer 160 of FIG. 1 is illustrated with a multilayered dielectric layer with polygonal cell structures with hallow interior. Herein, the polygonal cell structures are formed as substantially hexagonal opened pillars and can be formed in other above mentioned shapes and forms.

Figure 10A:
FIGS. 10a to 10h are schematic diagrams showing an exemplary process for forming the polygon cell structures in FIG. 9.

In FIG. 10a, a substrate, for example the dielectric layer 120 is provided, functioning as a carrier for subsequently formed layer. Herein, only the portion of the dielectric layer without conductive feature formed therein is illustrated for simplicity.

Figure 10B:
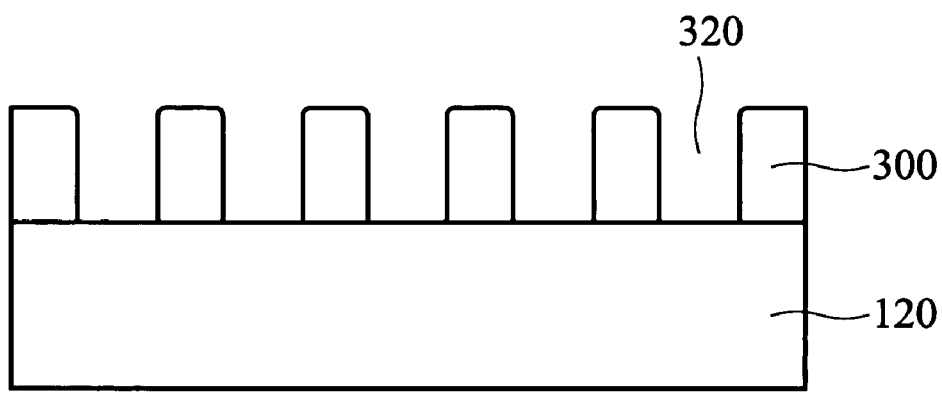

Next, in FIG. 10b, a template 300 with nano-pillared pores 32 arranged regularly therein is disposed on the dielectric layer 120. Suitable material for the template 300 can be inorganic materials such as oxide, metal, or a combination thereof, and the template 300 can also be an alumina template with nano-pillared pores 320 or a platinum-gold alloy template with nano-pillared pores 320. The nano-pillared pores 320 of the template 300 have apertures of about described sizes. Furthermore, the template 300 has a thickness not more than 5 μm, and a density of pores from $1 \times 10^6$ to $1 \times 10^{12}$ sites/cm$^2$. In this embodiment, the template 300 is an alumina template with nano-pillared pores, formed from immersing a high purity aluminum foil (99.99%) in an oxalic acid or sulfuric acid solution as electrolyte with low reaction temperature to perform an electrochemical anode corrosion. The obtained template 300 has hexagram nano-pillared pores which are arranged collaterally and regularly. Specifically, the aperture, density, and pore-to-pore spacing of the template can be modified by adjusting the type or concentration of the electrolyte, the low reaction temperature, the electrolytic voltage, and the reaction time.

Figure 10C:
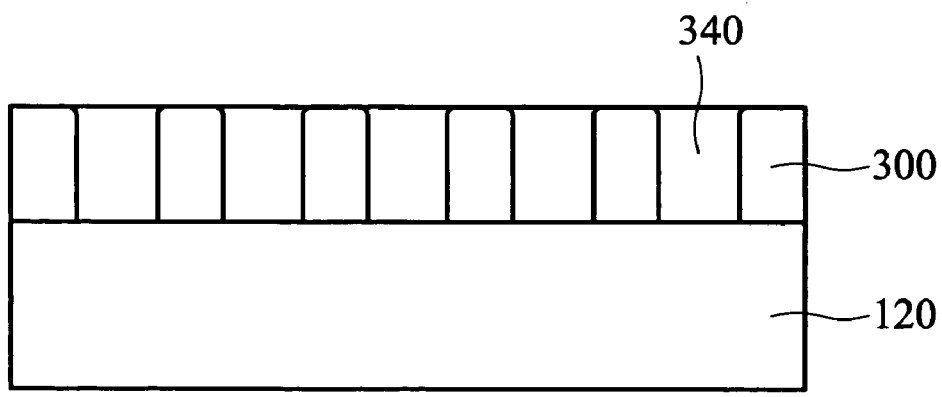
Figure 10D:
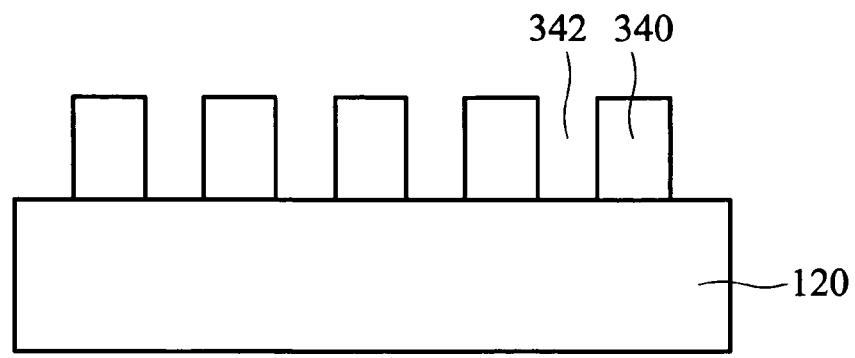

In FIG. 10c, after formation the template 300 over the dielectric layer 120, a polymeric or polymerizable material is laid on the template 300 to stuff up the pores 320 of the template 300 to form a plurality of nano-pillars 340 after removing the template 300, wherein the filler can be further solidified optionally. The polymeric material can be a conductive polymer, and the polymerizable material can be reactive monomer. In an embodiment of the invention, the nano-pillars 340 are formed by following steps. First, a reactive monomer, such as methyl methacrylate monomer composition with 5% benzoyl peroxide, is stuffed into the nano-pillared pores 320 of the template 300 under vacuum. Next, the reactive monomer is exposed to an actinic ray or heated to solidify. After removing the template 300, a plurality of nano-pillars 340 is formed on the dielectric layer 120 with a space 342 therebetween, as shown in FIG. 10d. Furthermore, in another embodiment of the invention, the nano-pillars 340 can be formed by electrochemical deposition to fill the pores 320 with a conductive polymer, such as polypyrrole, polyaniline, or polythiophene.

Figure 10E:
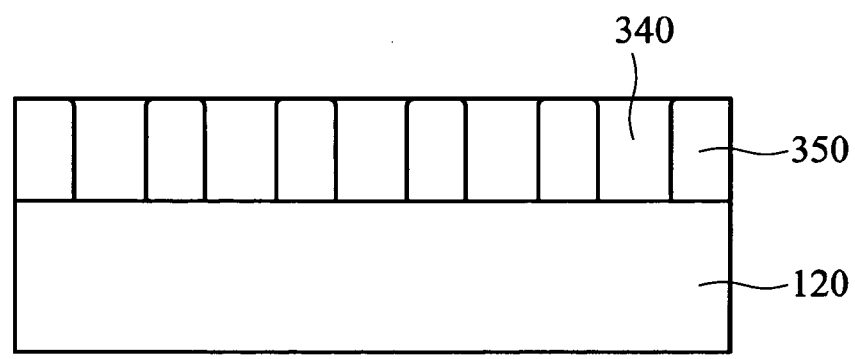

Next, referring to FIG. 10e, after removing the template 300, independent dielectric pillars 350 are formed to fill each space 342 between the nano-pillars 340 using the nano-pillars 340 as a negative template. The dielectric pillars 350 are composed of silicon-containing material, such as silicon nitride. Preferably, the conductive layer is carbide, silicon-containing material, organic dielectric material, or combinations thereof, such as $SiO_2$, SiOC, SiC, spin-on glass, or combinations thereof. The deposition process can be spin-coating, spray-coating, dip-coating, chemical vapor deposition, electric chemical deposition, sputtering, evaporation, chemical polymerization, or sol-gel coating. After formation of the dielectric pillars 350 on the dielectric layer 120, the layer comprising the dielectric pillars 350 and the nano-pillars 340 can optionally be subjected to an etch back process or chemical mechanical polishing.

Figure 10F:
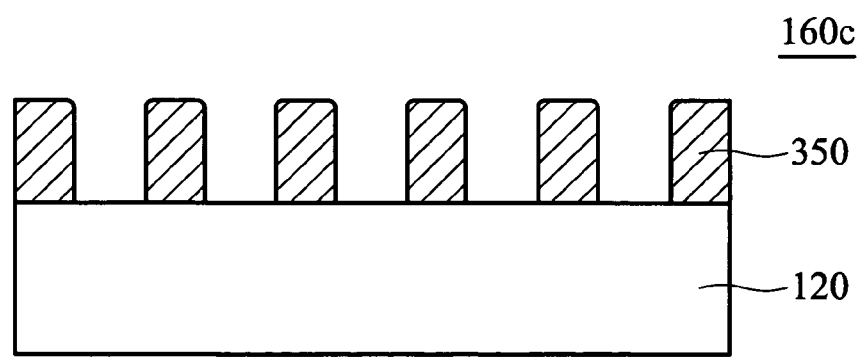

In FIG. 10f, the nano-pillars 340 are then removed by an organic solvent, such as ethyl acetate or isobutyl acetate (IBAC) to form a dielectric layer with a plurality of pores. Finally, a modification process is applied to the dielectric layer 160c with a plurality of pores to form a first sub-layer of the dielectric layer 160 with honeycomb-like pores.

Figure 10G:
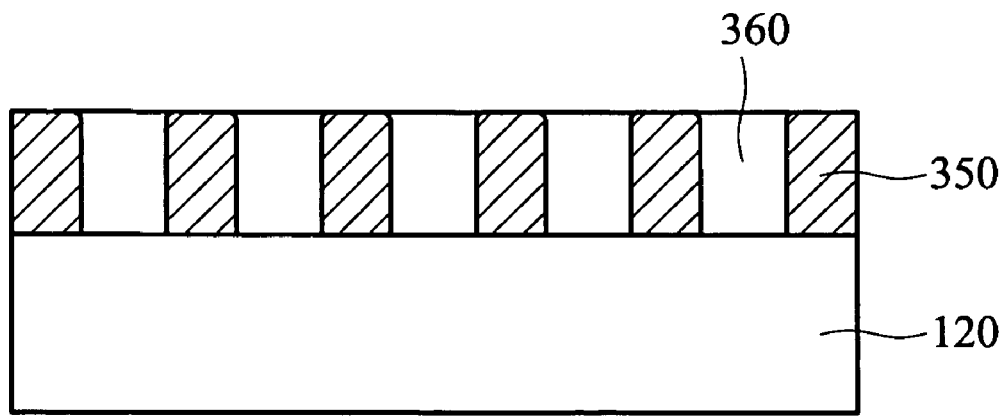

In FIG. 10g, another negative template 360 is formed to fill the spaces between the dielectric material 350 and planar a top surface thereof. The process illustrated in FIGS. 10a-10f is repeated again, using the planarized structure in FIG. 10g as a substrate. Therefore, a second sub-layer 160d comprising a plurality of dielectric pillars 370 respectively formed over an underlying dielectric pillar 350 is thus formed, as shown in 10h.

Figure 10H:
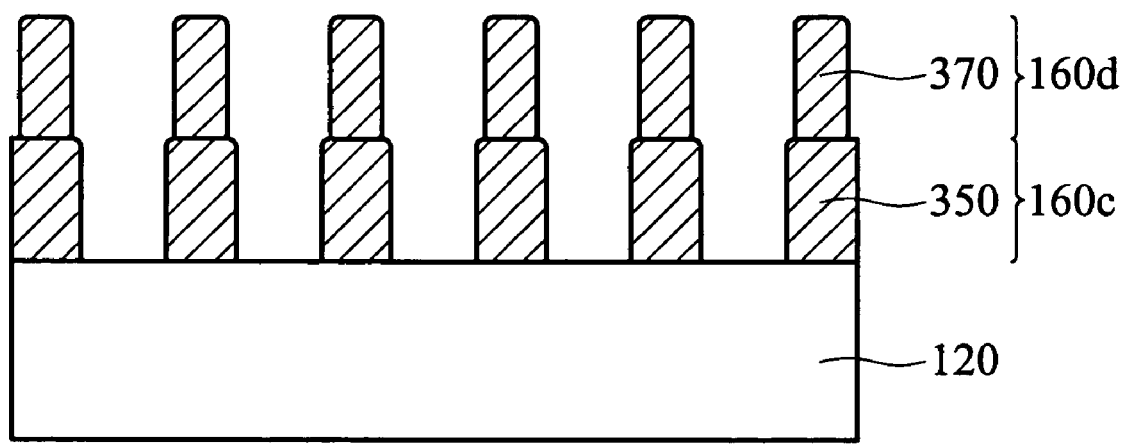

In addition, another a modification process (not shown) is also applied to the dielectric layer 160d in FIG. 10h with a plurality of pores to form a second sub-layer of the dielectric layer 160 with honeycomb-like pores. Therefore, fabrication of the dielectric layer comprising honeycomb-like pores arranged in a two dimensional layout with low dielectric constant and high mechanical strength is complete. The uniformity of aperture and arrangement of the honeycomb-like pores is improved through the modification process, wherein the modification process is a surface treatment, or annealing process, such as an excimer laser annealing process.

Figure 3:
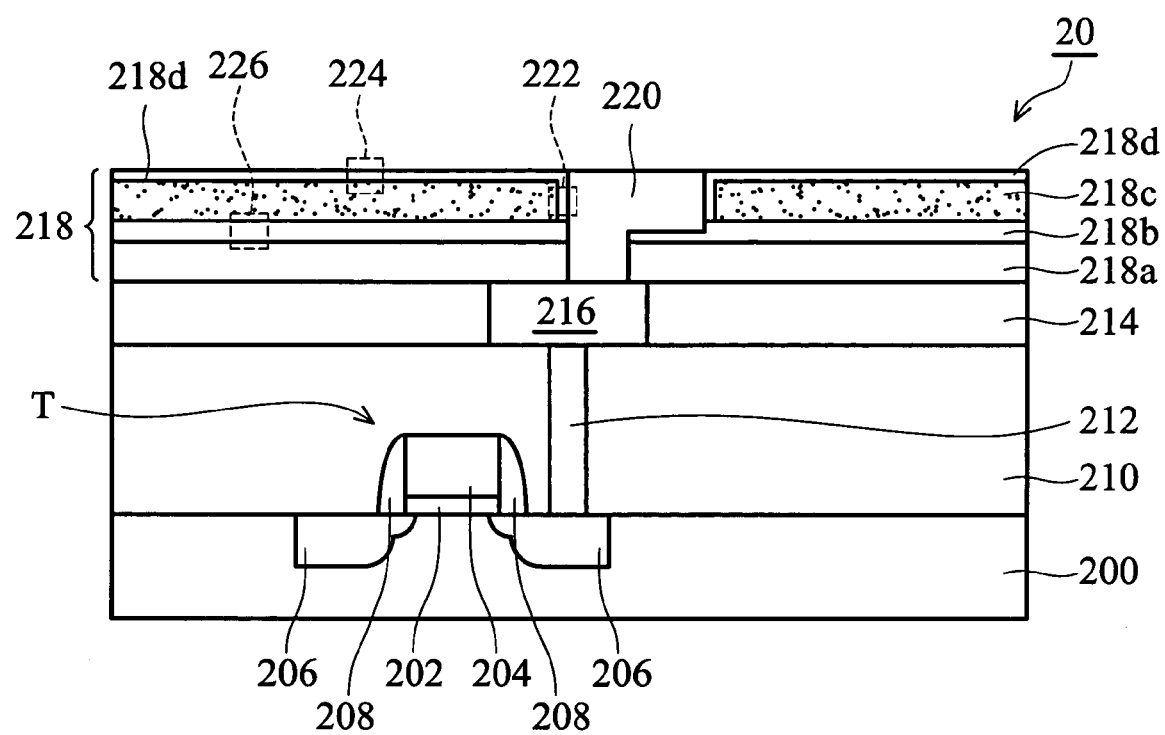
FIGS. 3, 5-6 are schematic diagrams of various embodiments of semiconductor devices implementing an interconnect structure including polygonal cell structures with hollow interior of the invention.
Figure 5:
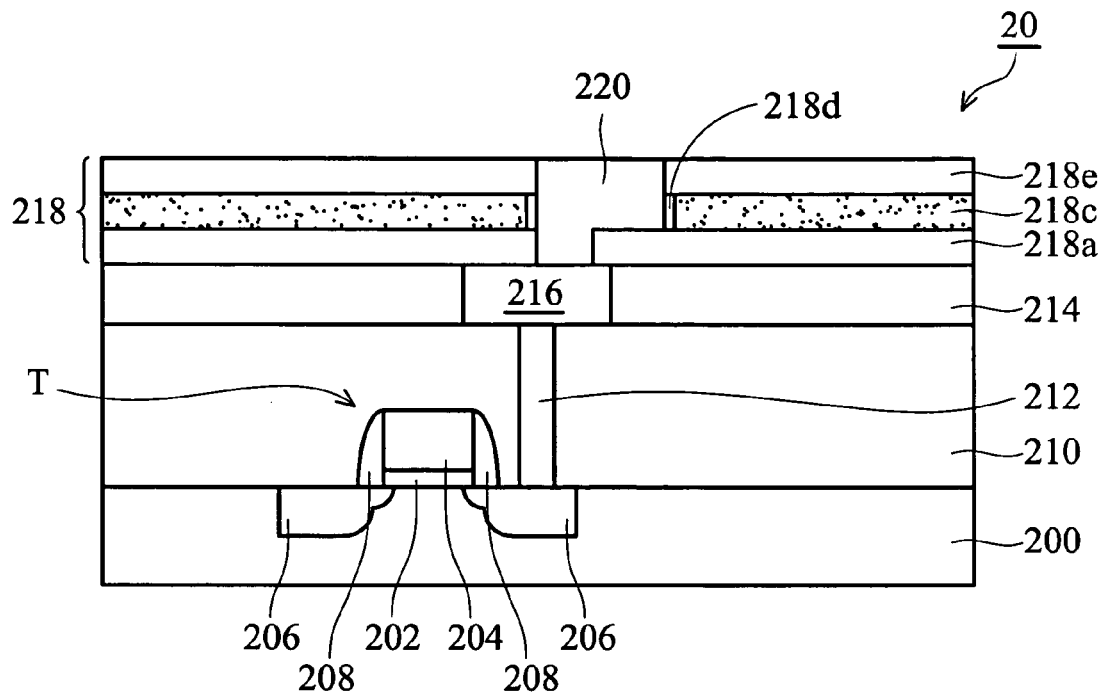
Figure 6:
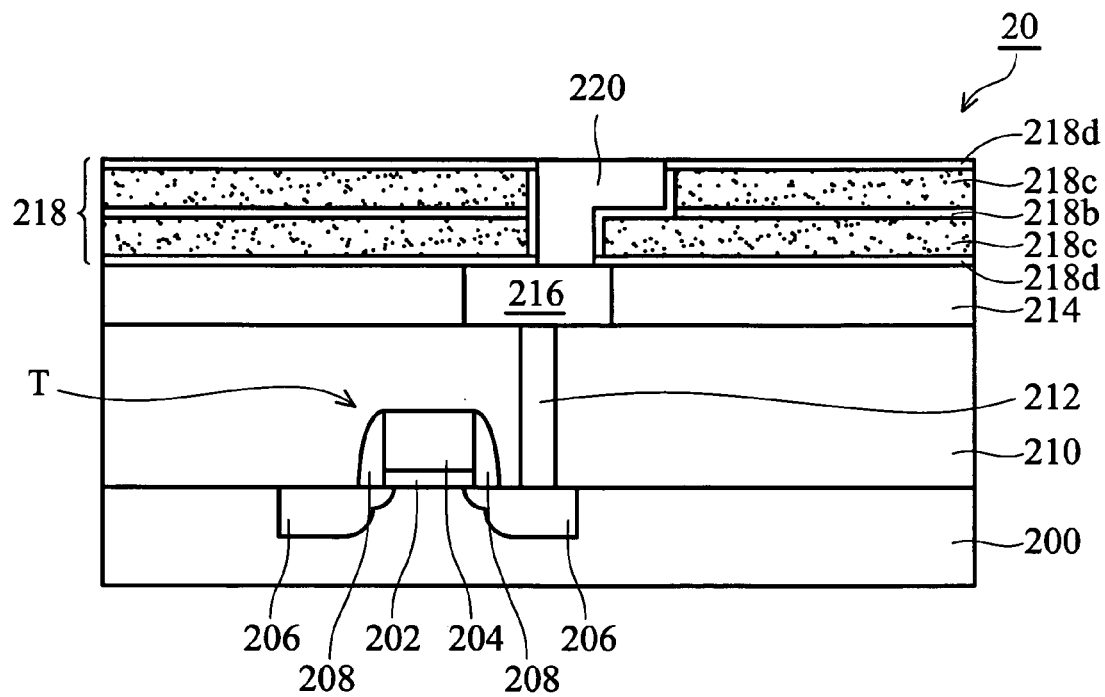

FIGS. 3, 5-6 are schematic diagrams of various embodiments of semiconductor devices implementing an interconnect structure including a dielectric layer having the same characteristics and structures of the dielectric layer 160 of FIG. 1.

FIG. 3 is a schematic cross section of a semiconductor device 20 including devices such as a field effect MOS transistor T formed over a substrate 200. The substrate 200 and the field effect MOS transistor T are covered by a dielectric layer 210. The MOS transistor T includes a gate electrode 204 overlying the substrate 200 with a gate dielectric 202 interposed therebetween, and a pair of source/drain regions 206 formed in the substrate 200 oppositely adjacent to the gate electrode 204. In addition, insulating sidewall spacers 208 may be formed on the sidewalls of the gate electrode 204. Process details for forming such a field effect transistor T are well known by those skilled in the art and are thus not described here. Typically and preferably, the dielectric layer 210 blanketly overlies the entire substrate surface including the MOS transistor T, as a pre-metal dielectric (PMD), and then a conductive contact plug 212 is formed down to the source/drain regions so as to be embedded in the dielectric layer 210. The conductive contact plugs 212 can be formed of electrically conductive materials including but not limited to metal, metal compound, metal alloy, doped polysilicon, or polycides. Moreover, a dielectric layer 214 including a conductive line 216 formed therewith is then formed over the dielectric layer 210 by conventional line fabrication.

Further, an interconnect structure such as a well known dual damascene structure as illustrated in FIG. 3 is formed over the dielectric layer 214 to provide an interconnection between the underlying semiconductor device and a subsequently formed metallizied layer (not shown). The dual damascene structure includes a composite dielectric layer 218 formed with a conductive feature 220. The conductive feature 220 is formed through the composite dielectric layer 218, having a line portion 220a and via portion 220b. The dielectric layer 218 includes a first dielectric portion 218a and second dielectric portion 218c. An etching stop layer 218b is preferably formed between the first dielectric portion 218a and the second dielectric portion 218c to provide etching stop function when forming the dual damascene structure. Herein, the second dielectric portion 218c has similar characteristics and structures to that of the dielectric layer 160 shown in FIG. 1 and is formed with a plurality of orderly arranged hollow polygon dielectric cell structures (not shown). Since second dielectric portion 218c includes polygon cell structures with hollow interior, a sealing/capping layer 218d is formed in regions near a top surface and the conductive feature 220 of the second dielectric portion 218c to provide functions such as diffusion barrier, etch stop, adhesion enhancement, planarization, or combinations thereof. The sealing/capping layer 218d can be formed at a thickness as that described in description of FIG. 1. The first dielectric portion 218a may comprise a dielectric material of higher dielectric constant and lower porosity than that of the second dielectric portion 218c. Materials for the first dielectric portion 218a can be, for example, FSG, silicon oxynitride, silicon oxide, carbon doped silicon oxide, silicon carbide, or nitride doped silicon carbide.

As shown in FIG. 3, the composite dielectric layer 218 may have an overall thickness of about 1000-8000 Å, an effective porosity of about 20-80% (in volume), and an overall dielectric constant of about 1.2-2.5. Thickness ratio between the first dielectric portion 218a and the second dielectric layer 218c is of about 1 to 1.5.

After formation of the second dielectric portion 218c, a surface treatment (not shown) such as thermal or radiation treatment is performed to the second dielectric portion 218c to stabilize or optimize the final size of polygon cell structures with hollow interior therein. The described sealing/capping layer 218d can be simultaneously formed in such surface treatment to seal the outer opening near the surface and thus reduces surface roughness of the second dielectric portion 218c. Moreover, the sealing/capping layer 218d can be also formed by depositing another dielectric layer with lower porosity and/or higher dielectric constant than that of the second dielectric portion 218c.

FIGS. 4a-4d are enlargements of regions 222, 224, and 226 in the second dielectric region 218c, respectively showing a micro-structure therein. The polygon cell structures with hollow interior in the second dielectric portion 218 are illustrated as polygonal dielectric cubes A with substantially hexagonal walls as shown in FIG. 2a, but are not limited thereto.

Figure 4A:
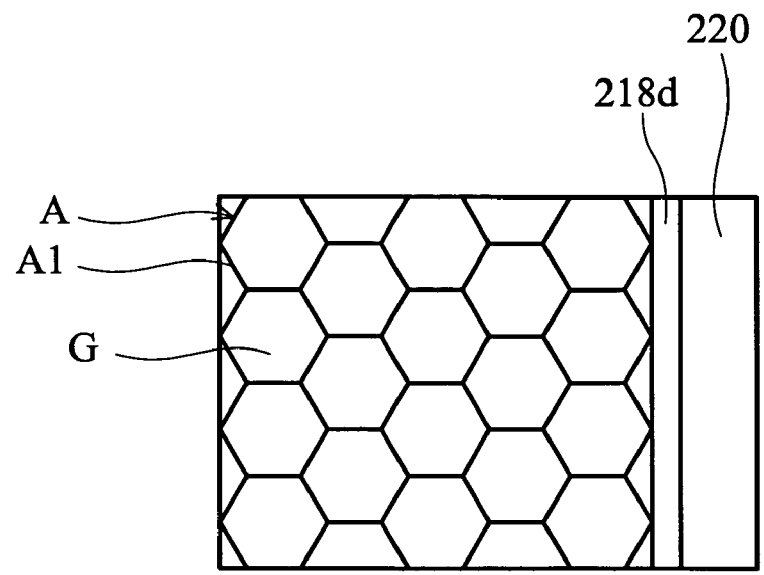
FIGS. 4a-4d are enlargements showing micro-structures of various dielectric regions of the semiconductor device in FIG. 3.
Figure 4B:
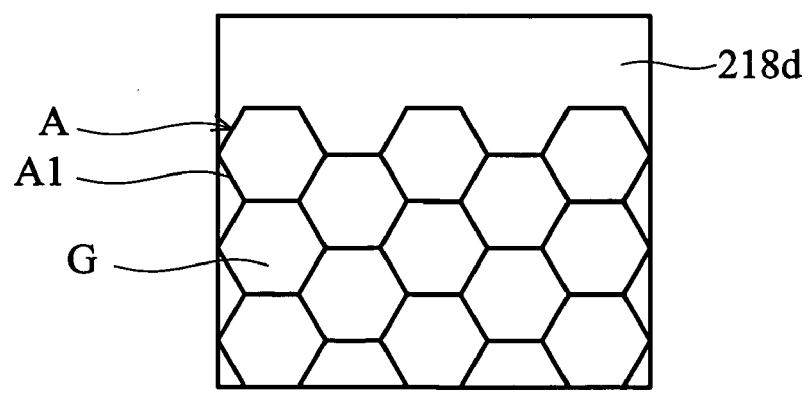
Figure 4C:
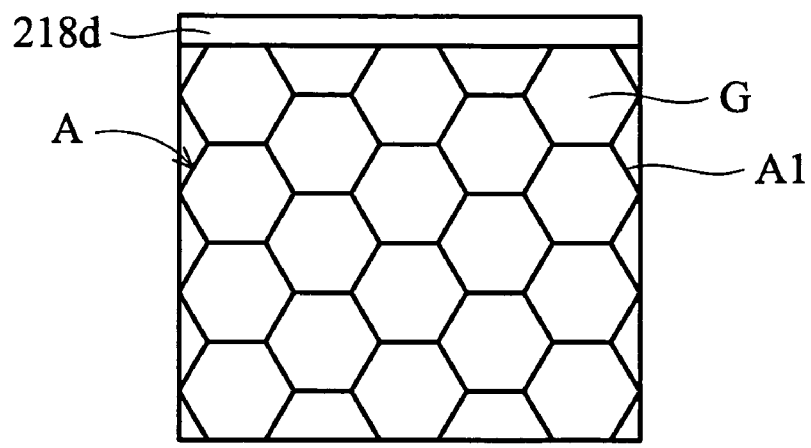

FIG. 4a shows a micro-structure of the region 222 in FIG. 3, illustrating the sealing/capping layer 218d interposed between the polygonal dielectric cubes A and the conductive feature 220, functioning as a liner therebetween. The sealing/capping layer 218d is illustrated as a layer formed by treating the polygonal cubes A and portions thereof adjacent to the conductive feature 220 are converted to a portion of the sealing/capping layer 218d. FIGS. 4b and 4c respectively show a structure of the region 224 in FIG. 3, respectively illustrating the sealing/capping layer 218d deposited over the polygonal cubes A and the sealing/capping layer 218d converted from portions of the polygonal cubes A near the top surface.

Figure 4D:
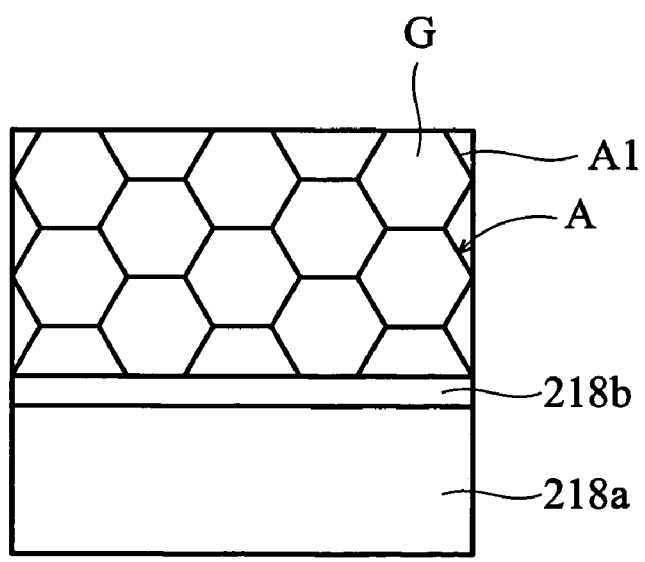

FIG. 4d shows a micro-structure of the region 226 in FIG. 3, illustrating the polygonal cubes A overlying the etch stop layer 218b.

FIGS. 5 and 6 are other exemplary embodiments of the semiconductor device 20 shown in FIG. 3, implementing an interconnect structure including a dielectric layer having the same characteristics and structures as the dielectric layer 160 of FIG. 1. In FIGS. 5 and 6, like numerals represent like structural components and only differences are discussed in the follow description.

As shown in FIG. 5, the composite dielectric layer 218 is illustrated as a tri-layered dielectric layer including a first dielectric portion 218a, a second dielectric portion 218c, and a third dielectric portion 218e. Similarly, the second dielectric portion 218c has similar characteristics and structures to that of the dielectric layer 160 shown in FIG. 1 and is formed with a plurality of polygon cell structures with hollow interior (not shown). Composition of the third dielectric portion 218e can be the same as that of the first dielectric portion 218a and preferably different from that of the second dielectric portion 218c. Therefore, there may not be a need to form an etch stop layer interposing the second dielectric portion 218c and the first and third dielectric portions 218a, 218e. However, a sealing/capping layer 218d is still needed and is formed in the portion of the second dielectric layer 218c adjacent to the conductive feature 220 to prevent metal diffusion.

As shown in FIG. 5, the composite dielectric layer 218 may have an overall thickness of about 3000-20000 Å, an effective porosity of about 10-80% (in volume), and an overall dielectric constant of about 1.2-2.5.

As shown in FIG. 6, the composite dielectric layer 218 is illustrated as a bi-layered dielectric layer comprised of two separated second dielectric portions 218c with etch stop layers 218b interposed therebetween. Herein, sealing/capping/etching stop layers 218d are respectively formed at the upper surface of the second dielectric portion 218c in a upper level and at a lower surface of the second dielectric portion 218c at the lower level to prevent undesired metal diffusion from the underlying conductive line 216 and the conductive feature 220 and also provide a planar top surface for the second dielectric portion 218c in the upper level.

Since the composite dielectric layer 218 surrounding the conductive feature 220 of the semiconductor device 20 in FIGS. 3, 5-6 has at least one dielectric portion having the polygon cell structures with hollow interior enhancing mechanical strength and reduce the effective dielectric constant thereof. The conductive feature 220 is properly passivated and supported, thus preventing undersired collapse in conventional low-k dielectric material and also providing a dielectric layer with low dielectric constant. Therefore, a more reliable semiconductor device can thus formed and electrical performances such as time dependant dielectric breakdown (TDDB), RC delay or electromigration (EM) thereof may thus enhanced.

Figure 7:
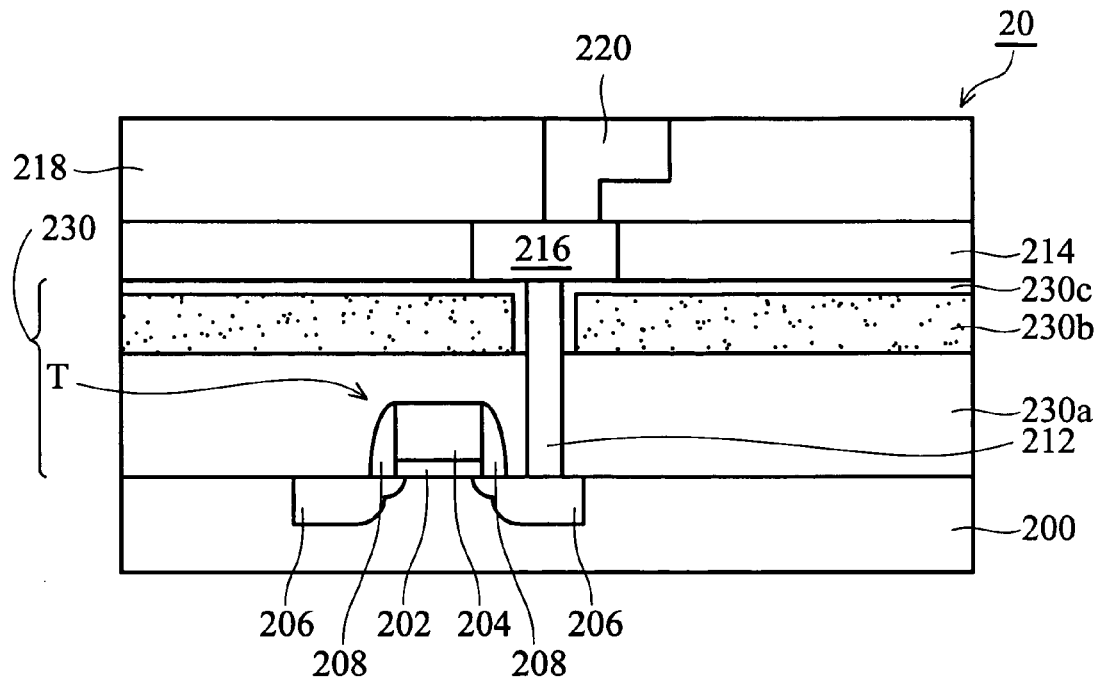
FIGS. 7-8 are schematic diagrams of various embodiments of semiconductor devices implementing a front end structure including the polygonal cell structures with hollow interior of the invention.
Figure 8:
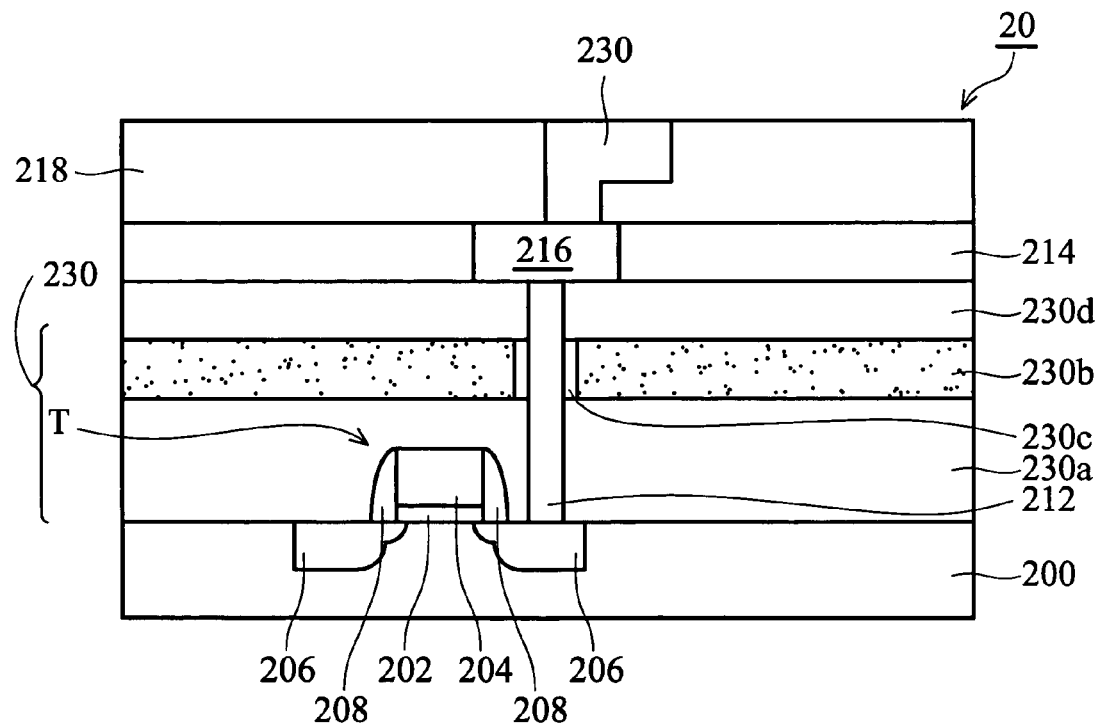

FIGS. 7 and 8 show various exemplary embodiments of the semiconductor device 20 shown in FIG. 3, implementing a dielectric layer having the same characteristics and structures as the dielectric layer 120 of FIG. 1 in the front-end structure. In FIGS. 7 and 8, like numerals represent like structural components and only differences are discussed in the follow description.

In FIG. 7, a composite dielectric layer 230 is formed in a front end portion of the semiconductor device 20 and overlies the transistor T and the substrate 200. The composite dielectric layer 230 is illustrated as a bi-layered dielectric layer including a first dielectric portion 230a and a second dielectric portion 230b. As shown in FIG. 7, the first dielectric portion 230a can comprise, for example, similar material to that of the dielectric layer 210 shown in FIGS. 3, 5-6. Herein, the second dielectric portion 230b comprises the same characteristics and structures of the dielectric layer 120 of FIG. 1 to thereby provide reinforced mechanical strength to support the overlying interconnect structure and lower the effective dielectric constant of the composite dielectric layer 230, thus may enhancing reliability and performance of the transistor T. An overlying interconnect structure formed over the composite dielectric layer 230 with similar components to FIG. 3 is not described here again, for simplicity. A sealing/capping layer 230c is needed and formed at the top surface and the sidewalls adjacent to the conductive contact 212 to prevent undesired metal diffusion and reduce surface roughness of the composite dielectric layer 230.

FIG. 8 illustrates another exemplary embodiment of the semiconductor device 20 shown in FIG. 7. An additional third dielectric portion 230d is formed over the second dielectric portion 230b to thereby form a tri-layered composite layer 230. Here, a seal layer 230c may be formed at sidewalls adjacent to the conductive contact plug 212.

The composite dielectric layer 230 surrounding the conductive contact plug 212 of the semiconductor device 20 in FIGS. 7-8 has at least one dielectric portion having the polygon cell structures with hollow interior enhancing mechanical strength and reducing the effective dielectric constant thereof. The conductive contact plug 212 is properly passivated and supported, preventing undersired collapse in conventional low-k dielectric material and also providing a dielectric layer with low dielectric constant. Therefore, a more reliable semiconductor device is thus formed and electrical performance thereof enhanced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interconnect structure for semiconductor device, comprising:
a substrate;
a first dielectric layer overlying the substrate, exposing a conductive feature formed through the first dielectric layer and connecting the substrate, wherein the first dielectric layer comprises a plurality of polygon cell structures with hollow interior and the polygon cell structures with hollow interior have an average feature cell size of about 10 Å to 100 Å and a dielectric liner formed between sidewalls of the conductive feature and the polygon cell structures with hollow interior in the first dielectric layer, wherein the dielectric liner includes a sealing layer with lower porosity than that of the first dielectric layer.

2. The interconnect structure of claim 1, wherein the polygon cell structures are honeycomb-like structures.

3. The interconnect structure of claim 2, the feature of honeycomb-like structure is a 2-D layered structure, 3-D stereo structure or a combination thereof.

4. The interconnect structure of claim 1, wherein the first dielectric layer has a thickness of about 1000 Å to 10000 Å.

5. The interconnect structure of claim 1, wherein the first dielectric layer has a porosity of about 20-80 vol %.

6. The interconnect structure of claim 1, further comprising a second dielectric layer formed between the polygon cell structures with hollow interior and the substrate, having a higher k value and lower porosity than that of the first dielectric layer.

7. The interconnect structure of claim 6, wherein film thickness of the second dielectric layer is less than about 500 Å.

8. The interconnect structure of claim 1, the dielectric liner formed between the conductive feature and the first dielectric layer, having a thickness of about 30 Å to 150 Å.

9. The interconnect structure of claim 1, wherein the conductive feature comprises copper, aluminum, tungsten or alloys thereof.

10. The interconnect structure of claim 1, wherein the first dielectric layer has an overall dielectric constant of about 1.2-2.5.

11. The interconnect structure of claim 10, further comprising a third dielectric layer other than the first dielectric layer overlying the first dielectric layer.

12. The interconnect structure of claim 11, wherein the third dielectric layer has a porosity less than that of the first dielectric layer.

13. The interconnect structure of claim 11, wherein the third dielectric layer has a thickness of about 200 Å to 500 Å.

14. The interconnect structure of claim 1, wherein the first dielectric layer comprises carbon-containing materials.

15. A dual damascene structure, comprising
a substrate;
a first dielectric layer with a conductive via contact therein, overlying the substrate and electrically connecting the substrate;
a second dielectric layer with a conductive line therein, overlying the first dielectric layer, wherein the conductive line electrically connects the conductive via contact and one or both of the first and second dielectric layers include a plurality of polygon cell structures with hollow interior, and the polygon cell structures with hollow interior have an average feature cell size of about 10 Å to 100 Å and a dielectric liner formed between sidewalls of the conductive feature and the polygon cell structures with hollow interior in the first dielectric layer, wherein the dielectric liner includes a sealing layer with lower porosity than that of the first dielectric layer.

16. The dual damascene structure of claim 15, wherein the polygon cell structures with hollow interior are honeycomb-like structures.

17. The interconnect structure of claim 15, wherein both of first and second dielectric layer comprises carbon-containing materials.

18. A semiconductor device, comprising:
a substrate with at least one device thereon;
a first dielectric layer with a conductive via contact therein, overlying the substrate and electrically connecting the device,
a second dielectric layer with a conductive feature therein, overlying the first dielectric layer, wherein the first dielectric layer includes a plurality of honeycomb-like polygon cell structures with hollow interior and the conductive feature electrically connects the conductive contact/via, and the honeycomb-like polygon cell structures with hollow interior have an average feature cell size of about 10 Å to 100 Å and a dielectric liner formed between sidewalls of the conductive feature and the polygon cell structures with hollow interior in the first dielectric layer, wherein the dielectric liner includes a sealing layer with lower porosity than that of the first dielectric layer.

* * * * *